(12) United States Patent
Milkov

(10) Patent No.: US 9,716,510 B2
(45) Date of Patent: Jul. 25, 2017

(54) COMPARATOR CIRCUITS WITH CONSTANT INPUT CAPACITANCE FOR A COLUMN-PARALLEL SINGLE-SLOPE ADC

(71) Applicant: TELEDYNE SCIENTIFIC & IMAGING, LLC, Thousand Oaks, CA (US)

(72) Inventor: Mihail Milkov, Moorpark, CA (US)

(73) Assignee: TELEDYNE SCIENTIFIC & IMAGING, LLC, Thousand Oaks, CA (US)

( * ) Notice: Subject to any disclaimer, the term of this patent is extended or adjusted under 35 U.S.C. 154(b) by 0 days.

(21) Appl. No.: 14/710,031

(22) Filed: May 12, 2015

(65) Prior Publication Data

US 2016/0336949 A1    Nov. 17, 2016

(51) Int. Cl.
*H03M 1/12* (2006.01)
*H03K 4/08* (2006.01)
*H03M 1/56* (2006.01)
*H03M 1/08* (2006.01)

(52) U.S. Cl.
CPC ............ *H03M 1/1245* (2013.01); *H03K 4/08* (2013.01); *H03M 1/08* (2013.01); *H03M 1/56* (2013.01)

(58) Field of Classification Search
CPC   H03M 1/24; H03M 1/245; H03M 1/52–1/58; H04N 5/37455; H04N 5/378
See application file for complete search history.

(56) References Cited

U.S. PATENT DOCUMENTS

| | | | |
|---|---|---|---|
| 4,940,982 A | 7/1990 | Gulczynski | 341/169 |
| 5,084,704 A | 1/1992 | Parrish | 341/164 |
| 6,956,413 B2 | 10/2005 | Bailey | 327/131 |
| 7,274,319 B2 | 9/2007 | Lee | 341/155 |
| RE41,767 E | 9/2010 | Lee | 341/155 |
| 8,072,522 B2 * | 12/2011 | Taura | H04N 3/1512 341/155 |

(Continued)

*Primary Examiner* — Howard Williams
(74) *Attorney, Agent, or Firm* — Koppel, Patrick, Heybl & Philpott

(57) ABSTRACT

Comparator circuits suitable for use in a column-parallel single-slope ADC comprise a comparator, an input voltage sampling switch connected between an input voltage $V_{in}$ and a first node, and a sampling capacitor connected between the first and second nodes and which stores a voltage which varies with $V_{in}$ when the sampling switch is closed. A first reset switch is connected between the second node and a reset voltage, an isolation buffer is coupled between the second node and a comparator input, and a voltage ramp switch applies a voltage ramp $V_{ramp}$ to the first node when closed. The comparator output toggles when $V_{ramp}$ exceeds $V_{in}$, with the isolation buffer maintaining a nearly constant capacitive load on $V_{ramp}$. A 'ramp disconnect' feature can be used to increase the circuit's input range, and a dummy capacitor can be employed to maintain a constant capacitance on $V_{ramp}$.

23 Claims, 6 Drawing Sheets

(56) References Cited

U.S. PATENT DOCUMENTS

| | | | |
|---|---|---|---|
| 8,149,289 B2* | 4/2012 | Lim | H04N 5/378 |
| | | | 348/222.1 |
| 8,482,447 B2 | 7/2013 | Hwang et al. | 341/169 |
| 8,624,769 B2 | 1/2014 | Wrigley et al. | 341/155 |
| 8,724,001 B2 | 5/2014 | Ay | 348/308 |
| 8,766,843 B2* | 7/2014 | Ueno | H03M 1/0863 |
| | | | 341/169 |
| 8,854,244 B2 | 10/2014 | Park et al. | 341/169 |
| 2006/0125673 A1 | 6/2006 | Lee | 341/155 |
| 2007/0008206 A1 | 1/2007 | Tooyama et al. | 341/155 |
| 2008/0094271 A1 | 4/2008 | Tooyama et al. | 341/155 |
| 2008/0180298 A1 | 7/2008 | Lim | 341/158 |
| 2009/0195431 A1 | 8/2009 | Snoeij et al. | 341/155 |
| 2010/0039306 A1 | 2/2010 | Simony et al. | 341/156 |
| 2012/0050082 A1 | 3/2012 | Danesh et al. | 341/122 |
| 2013/0062503 A1* | 3/2013 | Saito | H04N 5/3575 |
| | | | 250/208.1 |
| 2013/0258157 A1 | 10/2013 | Nam et al. | 348/311 |
| 2014/0036124 A1 | 2/2014 | Higuchi et al. | 348/302 |
| 2015/0116558 A1* | 4/2015 | Tezuka | H04N 5/3658 |
| | | | 348/294 |

* cited by examiner

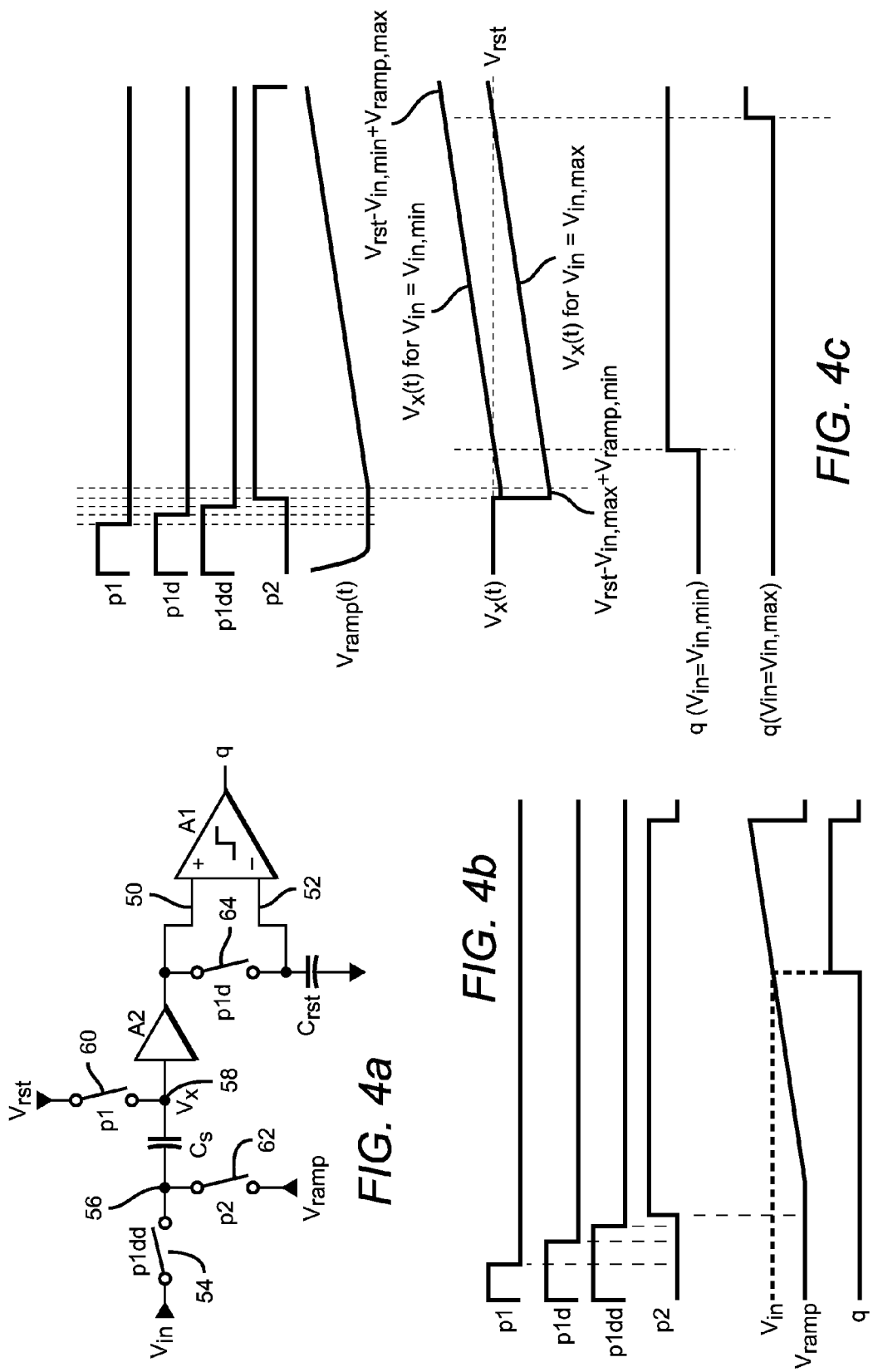

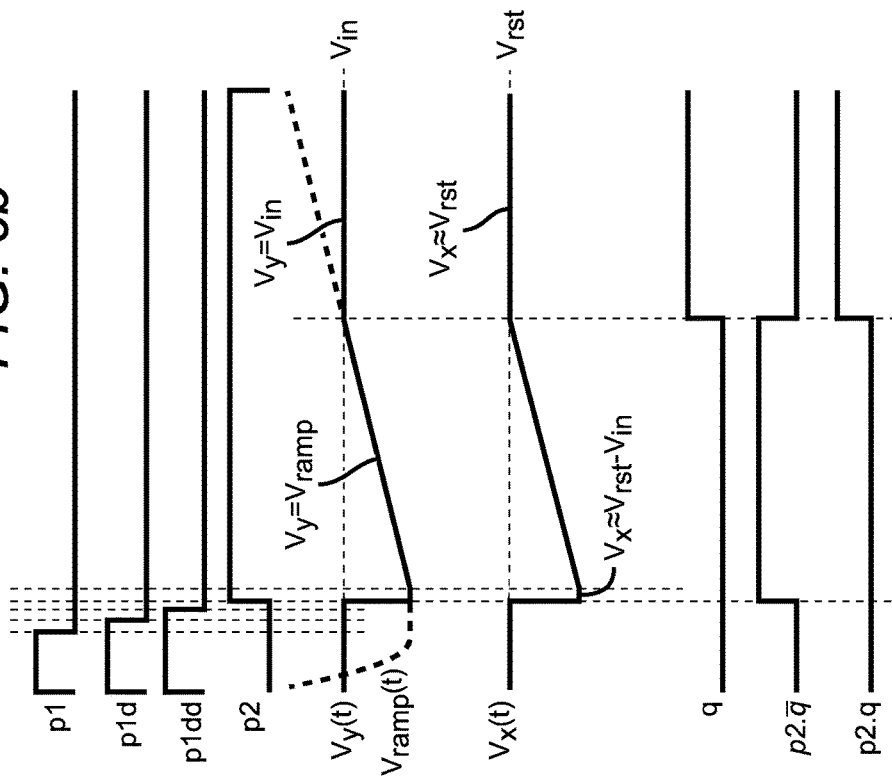
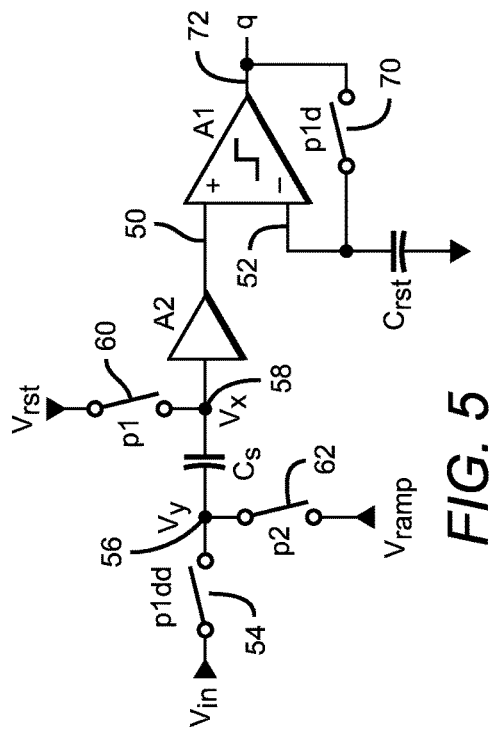
FIG. 5
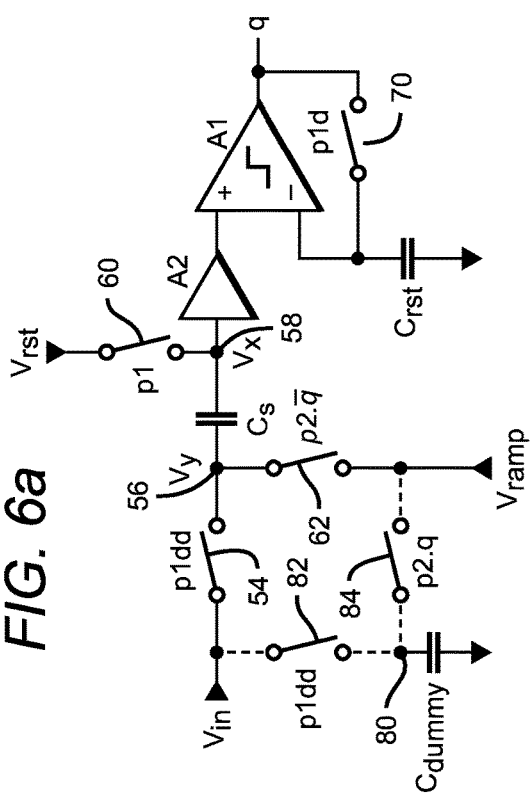
FIG. 6a

COMPARATOR CIRCUITS WITH CONSTANT INPUT CAPACITANCE FOR A COLUMN-PARALLEL SINGLE-SLOPE ADC

GOVERNMENT LICENSE RIGHTS

This invention was made with Government support under Contract No. FA8650-07-C-5414 awarded by the Air Force Research Laboratory. The Government has certain rights in the invention.

BACKGROUND OF THE INVENTION

Field of the Invention

This invention relates generally to comparator circuits, and more particularly to comparator circuits used in column-parallel single-slope analog-to-digital converters (ADCs).

Description of the Related Art

Image sensors generally include an array of pixels arranged in rows and columns. One common approach to reading out the voltages produced by the pixels in each column is to use column-parallel single-slope ADCs. A typical arrangement is shown in FIG. 1. A voltage from each column, $V_{in0}$, $V_{in1}$, ..., $V_{inx}$ is provided to one input of respective comparators A0, A1, ..., Ax, each of which also receives a shared (or 'global') voltage ramp $V_{ramp}$ produced by a ramp generator 10. During each row readout period, $V_{ramp}$ increases linearly and covers the full input signal range. The output of each comparator toggles when $V_{ramp}$ exceeds its column voltage ($V_{in0}$, $V_{in1}$, ..., $V_{inx}$). The system typically includes a common counter 12, and the columns typically include respective memory locations 14, 16, 18; when the output of each column's comparator toggles, the current counter value is stored in the column's memory location and is a digital representation of the column voltage. Note that a comparator and a memory location are located in each column.

As noted above, each comparator receives a common ramp voltage $V_{ramp}$, which is generated by a ramp generator such as the basic ramp generator 10 shown in FIG. 2. A capacitor $C_{ramp}$ is connected to a constant current source 20 via a switch 22 operated with an enable signal 'en', and to a constant potential such as ground via a switch 24 operated with a reset signal 'rst'. In operation, closing switch 22 causes $V_{ramp}$ to start increasing linearly, and closing switch 24 causes $V_{ramp}$ to reset to the constant potential such as ground.

Several types of comparator circuits are used in column-parallel single-slope ADCs. An example of an "AC-coupled" comparator circuit is shown in FIG. 3a, and a timing diagram which illustrates the operation of the circuit is shown in FIG. 3b. The column voltage ($V_{in}$) is connected to one side of a switch 40 operated with a control signal p1d; a sampling capacitor $C_s$ is connected between the other side of the switch and one of the inputs of comparator A0. A reset capacitor $C_{rst}$ is connected to the other comparator input, which is initialized to a voltage $V_{rst}$ via switches 42 and 44, each of which is operated with a control signal p1. Global voltage ramp $V_{ramp}$ is connected to the input side of $C_s$ via a switch 46 operated with a control signal p2.

As shown in FIG. 3b, during the sampling phase (signals p1 and p1d are high and p2 is low) switches 40, 42 and 44 are closed such that $V_{rst}$ is stored on $C_{rst}$, and $V_{in}-V_{rst}$ is stored on $C_s$. During the ramping phase (signals p1 and p1d are low and p2 is high), switch 46 is closed, thereby applying $V_{ramp}$ to the input side of $C_s$. As $V_{ramp}$ increases, at some point it exceeds $V_{in}$. Because of charge conservation, at this instant the voltage at node $V_x$ exceeds $V_{rst}$ and the output q of A0 toggles.

AC-coupling the input signal and the ramp voltage as illustrated in FIG. 3a enables the comparator operating point and propagation delay to be constant regardless of the input voltage $V_{in}$. However, the AC-coupled comparator circuit of FIG. 3a still suffers from several inherent problems. Global voltage ramp $V_{ramp}$ is affected by both comparator kickback and a varying capacitive load, the latter resulting from variation in the operating point of the comparator input devices as the comparator nears and crosses the tripping point. Both effects may degrade the quality of the global voltage ramp $V_{ramp}$ and consequently lead to ADC non-linearity and crosstalk among ADCs. Another drawback is that the permissible input swing for input voltage $V_{in}$ is limited to approximately Vdd/2, where Vdd is the circuit's supply voltage. This is explained as follows:

With reference to FIG. 3a, the node voltage at the junction of $C_s$ and the comparator is $V_x$. As shown in FIG. 3b, $V_x(t)$ is plotted for minimum and maximum value of $V_{in}$ with a solid and a dotted line, respectively. The minimum value of $V_x$ is reached at the beginning of the ramp and is given by:

$$V_{x,min} = V_{rst} - V_{in,max} + V_{ramp,min},$$

The maximum value of $V_x$ is reached at the end of the ramp and is given by:

$$V_{x,max} = V_{rst} - V_{in,min} - V_{ramp,max}.$$

Here $V_{in,min}$ and $V_{in,max}$ define the smallest and largest possible values of $V_{in}$, and $V_{ramp,min}$ and $V_{ramp,max}$ define the smallest and largest ramp voltages. Therefore:

$$V_{x,max} - V_{x,min} = (V_{ramp,max} - V_{ramp,min}) + (V_{in,max} - V_{in,min})$$

If $V_{in,max} = V_{ramp,max}$ and $V_{in,min} = V_{ramp,min}$ (i.e., the ramp spans the entire input range of the comparator), then $V_{x,max} - V_{x,min} = 2(V_{in,max} - V_{in,min})$.

If during the ramping phase $V_x$ should exceed one of the supply rails, switch 42 or switch 44 would leak and capacitor $C_s$ would no longer be floating. This would dramatically increase the load on the shared voltage ramp and corrupt it. To prevent this strong crosstalk scenario, one must ensure that $V_{x,max} - V_{x,min} \approx Vdd$. It follows that $V_{in,max} - V_{in,min} \approx Vdd/2$.

SUMMARY OF THE INVENTION

Comparator circuits suitable for use in a column-parallel single-slope ADC are presented which address several of the problems noted above. Benefits provided by the various comparator circuit embodiments described herein include substantially constant capacitive load on the global voltage ramp and a rail-to-rail input range.

One embodiment of the present comparator circuit comprises a comparator having first and second input terminals, an input voltage sampling switch connected between an input voltage ($V_{in}$) and a first node, and a sampling capacitor connected between the first node and a second node and arranged to store a voltage which varies with $V_{in}$ when the sampling switch is closed. The circuit further includes a first reset switch connected between the second node and a reset voltage, an isolation buffer having an input coupled to the second node and an output coupled to the comparator's first input terminal, and a voltage ramp switch arranged to apply a global voltage ramp ($V_{ramp}$) to the first node when closed. The comparator circuit is arranged such that the output of the comparator toggles when $V_{ramp}$ exceeds $V_{in}$, and such that the isolation buffer maintains a substantially constant capacitive load on $V_{ramp}$.

In some embodiments, the comparator circuit is arranged to open the voltage ramp switch when the output of the comparator toggles to indicate that $V_{ramp}$ exceeds $V_{in}$. This serves to increase the comparator circuit's input range. To maintain a constant capacitance on $V_{ramp}$ when the ramp switch is opened, a dummy capacitor can be employed which is coupled to $V_{ramp}$ when the comparator output toggles. Other described embodiments include features such as autozeroing and correlated double sampling (CDS).

These and other features, aspects, and advantages of the present invention will become better understood with reference to the following drawings, description, and claims.

BRIEF DESCRIPTION OF THE DRAWINGS

FIG. 3b is a timing diagram for the comparator circuit of FIG. 3a.

FIG. 4a is a schematic diagram of one possible embodiment of a comparator circuit per the present invention.

FIG. 4b is a timing diagram for the comparator circuit of FIG. 4a.

FIG. 4c is a more detailed timing diagram for the comparator circuit of FIG. 4a.

FIG. 5 is a schematic diagram of one possible embodiment of a comparator circuit per the present invention, which includes an autozeroing function.

FIG. 6a is a schematic diagram of another possible embodiment of a comparator circuit per the present invention, which includes autozeroing, 'ramp disconnect' and 'dummy capacitor' features.

FIG. 6b is a timing diagram for the comparator circuit of FIG. 6a.

FIG. 7a is a schematic diagram of another possible embodiment of a comparator circuit per the present invention, which includes an autozeroing function and provides CDS.

FIG. 7b is a timing diagram for the comparator circuit of FIG. 7a.

FIG. 8b is a timing diagram for the comparator circuit of FIG. 8a.

FIGS. 9a and 9b are schematic diagrams of CTIA-based ramp generators which generate ramps having positive and negative slopes, respectively.

DETAILED DESCRIPTION OF THE INVENTION

Figure 1:
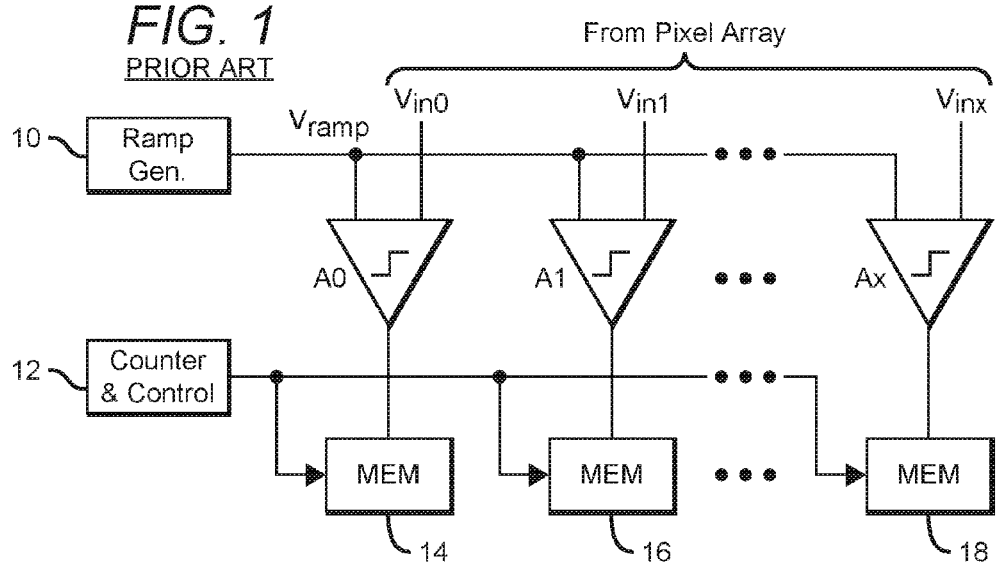
FIG. 1 is a block diagram of a known column-parallel single-slope ADC.

One possible embodiment of a comparator circuit in accordance with the present invention, suitable for use in a column-parallel single-slope ADC, is shown in FIG. 4a, with a corresponding timing diagram shown in FIG. 4b. The circuit includes a comparator A1 having first and second input terminals 50 and 52. An input voltage sampling switch 54 is connected between an input voltage $V_{in}$ and a first node 56. A sampling capacitor $C_s$ is connected between first node 56 and a second node 58 and arranged to store a voltage which varies with $V_{in}$ when sampling switch 54 is closed. A first reset switch 60 is connected between second node 58 and a reset voltage $V_{rst}$. The comparator circuit also includes an isolation buffer A2 having an input and an output, with the buffer input coupled to second node 58 and the buffer output coupled to the comparator's first input terminal 50. A voltage ramp switch 62 is arranged to apply a global voltage ramp $V_{ramp}$ to first node 56 when closed. Circuitry is preferably provided to apply a reset voltage to the comparator's second input terminal 52 such that the comparator operating point is independent of the input voltage; in this exemplary embodiment, the circuitry consists of a second reset switch 64 which connects first input terminal 50 to second input terminal 52 when closed, and a reset capacitor $C_{rst}$ connected between second input terminal 52 and a constant potential such as ground.

The operation of the circuit is illustrated in the timing diagram shown in FIG. 4b. First reset switch 60 is operated with a control signal p1, second reset switch 64 is operated with a control signal p1d, sampling switch 54 is operated with a control signal p1dd, and voltage ramp switch 62 is operated with a control signal p2. During the sampling phase, switches 54, 60 and 64 are closed such that buffered $V_{rst}$ is stored on $C_{rst}$, and $V_{in}-V_{rst}$ is stored on $C_s$. Control signals p1 and p1d are preferably arranged such that switch 64 is opened a short delay after switch 60, and switch 54 is opened a short delay after switch 64. Using this "bottom-plate sampling" technique, the signal sampled on $C_s$ is free of the input-dependent charge injection error of switch 54 (typically a MOSFET); bottom-plate sampling can be used effectively with the present comparator circuit, and is preferred. During the ramping phase, switch 62 is closed, thereby applying the ramp voltage $V_{ramp}$ to the input side of $C_s$ (first node 56). $V_{ramp}$ is capacitively coupled through $C_s$ such that as $V_{ramp}$ increases so do the voltages at second node 58 ($V_x$) and first input terminal 50. As $V_{ramp}$ increases, at some point it exceeds $V_{in}$. Because of charge conservation, at this instant the voltage at second node 58 ($V_x$) exceeds $V_{rst}$ and the output of A1 toggles. It is noteworthy that at the instant when the comparator output toggles, its input common-mode voltage is not a function of $V_{in}$ but instead is always at buffered $V_{rst}$, the voltage defined during the reset phase.

Figure 2:
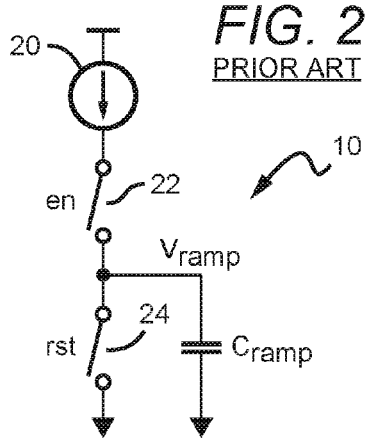
FIG. 2 is a schematic diagram of a known ramp generator.

The arrangement shown in FIG. 4a provides several benefits. At the time the comparator output toggles, $V_{in}=V_{ramp}$ and $V_x=V_{rst}$. Therefore, the operating points of the comparator and isolation buffer A2 are constant and independent of the input $V_{in}$, as is the comparator's propagation delay. The bottom-plate sampling technique and the constant comparator propagation delay ensure good comparator linearity and consequently good single-slope ADC linearity. Isolation buffer A2 isolates $V_{ramp}$ from comparator kickback and ensures that the capacitive load on $V_{ramp}$ remains constant. This greatly reduces crosstalk effects among ADCs through $V_{ramp}$ and makes ramp generation easier. For example, $V_{ramp}$ can be generated by means of flowing a constant current through a large capacitor (as shown in FIG. 2) without any buffering. The timing arrangement of having switch 64 close a brief delay after switch 60 cancels the clock feedthrough and charge injection error that might otherwise arise due to switch 60 (typically a MOSFET). Furthermore, this arrangement serves to cancel offset associated with isolation buffer A2, and to suppress the buffer's flicker (1/f) noise. By having switch 54 close a brief time after switch 64, there is no input-dependent charge injection error due to switch 54. A consequence of the constant comparator operating point is that the linearity of the isolation buffer A2 is not critical and does not affect the overall ADC linearity. As a result, the isolation buffer A2 can be implemented as a simple source follower. The timing diagrams shown in FIGS. 4b and 4c show a delay between the p2 rising edge (when voltage ramp switch 62 is closed) and the start of $V_{ramp}$ increasing. This is preferred. There are typically numerous comparator circuits, each of which connect to $V_{ramp}$ simultaneously on the rising edge of p2 through voltage ramp switches. This can cause a glitch on the $V_{ramp}$ signal because of charge sharing between the capacitance on $V_{ramp}$ and the parasitic capacitances on nodes 56 and 58 in each comparator circuit. Therefore, it is best to keep the $V_{ramp}$ signal reset long enough so that the glitch is absorbed.

Figure 3A:
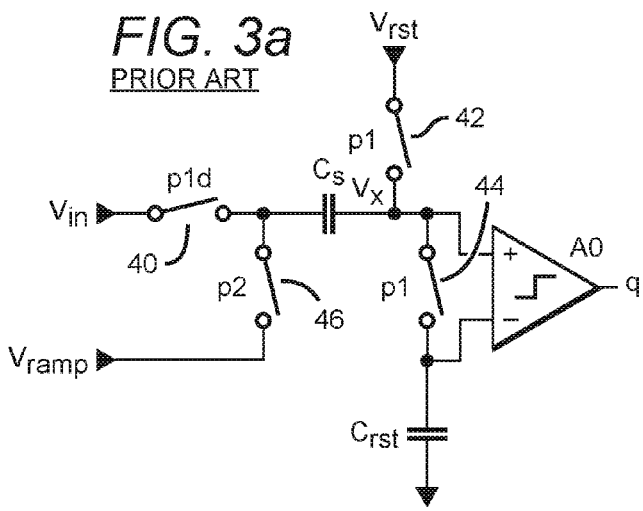
FIG. 3a is a schematic diagram of a known AC-coupled comparator circuit as might be used in a column-parallel single-slope ADC.
Figure 3B:
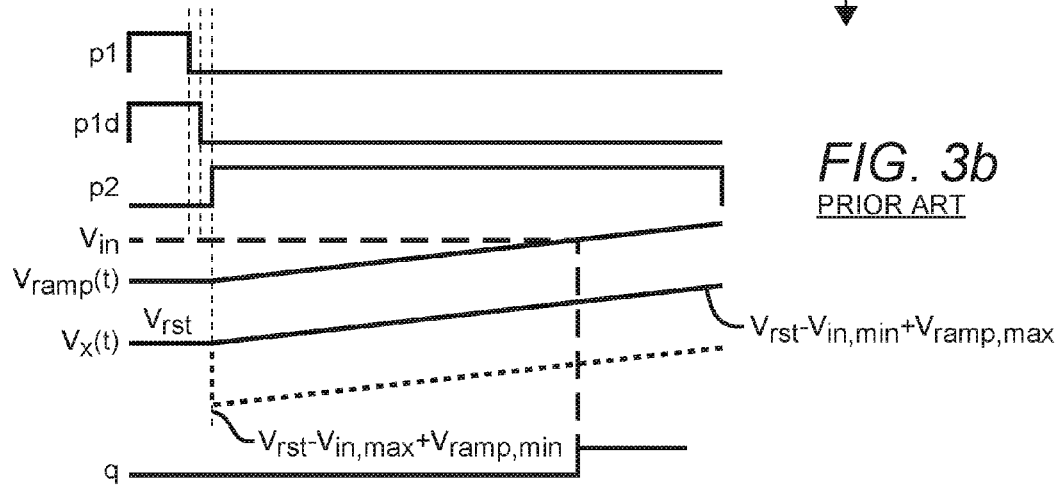

Though there are many advantages to the comparator circuit of FIG. 4a, there are also drawbacks. One drawback is that the offset associated with comparator A1 is not cancelled. Another is that the $V_{in}$ range is limited to approximately Vdd/2 in order to constrain the voltage excursion of node 58 ($V_x$) within the supply rails. The reasons for this range limitation were explained in detail in the discussion above in connection with FIG. 3b and also apply to the embodiment of FIG. 4a; a timing diagram illustrating this limitation as it applies to the embodiment of FIG. 4a is shown in FIG. 4c. A technique for overcoming this input range limitation is discussed below.

As noted above, circuitry is preferably provided to apply a reset voltage to comparator's second input terminal 52 such that the comparator operating point is independent of the input voltage. Another possible implementation of such circuitry is shown in FIG. 5, which both applies a reset voltage and provides autozeroing to cancel the offset of comparator A1. Here, reset capacitor $C_{rst}$ is connected as in FIG. 4a, but now a second reset switch 70 is connected between the comparator's second input terminal 52 and its output 72. The timing diagram for this embodiment is the same as that shown in FIG. 4b, with switch 72 preferably operated with control signal p1d. The advantages and drawbacks of this arrangement are the same as those described above, except that the offset associated with comparator A1 is cancelled.

The present comparator circuit may also be arranged to open the voltage ramp switch when the output of the comparator toggles to indicate that $V_{ramp}$ exceeds $V_{in}$, which has the effect of increasing the circuit's input range. One possible embodiment which includes this feature is shown in FIG. 6a, with detailed operational timing waveforms shown in FIG. 6b. The configuration is similar to that shown in FIG. 5, but here the voltage ramp switch 62 is operated with a control signal p2.$\bar{q}$ (the logic AND of signal p2 and the inverse of the comparator output q) whose timing is shown in FIG. 6b. The voltage ramp switch 62 closes when p2 goes high as before, but opens when comparator output q goes high (and $\bar{q}$ goes low) to indicate that $V_{ramp}$ has exceeded $V_{in}$. Consequently, as illustrated in FIG. 6b, node 58 ($V_x$) varies from a minimum of approximately $V_{rst}$-$V_{in}$ when signal p2 goes high to a maximum of approximately $V_{rst}$. If $V_{rst}$ is selected to be close to Vdd, then $V_{in}$ can vary from 0 to Vdd while node 58 ($V_x$) will not exceed the supply rails. Thus the input range is increased to ~Vdd.

If the 'ramp disconnect' technique described above is employed, the capacitance on global voltage ramp $V_{ramp}$ will decrease abruptly when comparator output q goes high and voltage ramp switch 62 is opened. This is because when voltage ramp switch 62 is opened the parasitic capacitances at nodes 56 and 58 and the input capacitance of isolation buffer A2 are no longer coupled to $V_{ramp}$. Depending on the ramp implementation, the change in the capacitance on $V_{ramp}$ may lead to non-linearity. For example, this would be the case for the ramp generator illustrated in FIG. 2. This change in $V_{ramp}$ capacitance can be overcome with the use of an optional 'dummy capacitor' $C_{dummy}$, arranged to be connected to $V_{ramp}$ when the voltage ramp switch is opened. One possible implementation is shown in FIG. 6a, with $C_{dummy}$ connected between a third node 80 and a constant potential. A first dummy capacitor switch 82 is connected between third node 80 and input voltage $V_{in}$, and a second dummy capacitor switch 84 is connected between the third node and $V_{ramp}$.

In operation, the comparator circuit is arranged to operate first dummy capacitor switch 82 synchronously with input voltage sampling switch 54 (i.e., using control signal p1dd), and to operate second dummy capacitor switch 84 with a control signal p2.q (the logic AND of signal p2 and the comparator output q) whose timing is shown in FIG. 6b. When so arranged, $C_{dummy}$ is precharged to $V_{in}$ during the sampling phase (when p1dd is high). During the ramping phase (when p2 is high), when the output of comparator A1 toggles to indicate that $V_{ramp}$ has exceeded $V_{in}$, voltage ramp switch 62 is opened and second dummy capacitor switch 84 is closed, such that the capacitance on $V_{ramp}$ is maintained approximately constant. $C_{dummy}$ is preferably selected such that its capacitance substantially equals the sum of the parasitic capacitances at first node 56, second node 58 and the input capacitance of isolation buffer A2. Both 'ramp disconnect' and 'dummy capacitor' features are shown in FIG. 6a, though it should be noted that the 'ramp disconnect' feature could be used without the 'dummy capacitor' feature.

For pixels having a large conversion gain (expressed in μV per electron) or equivalently, for pixels having a small integration node capacitance, the pixel reset noise can dominate the overall readout noise and it is therefore desirable to cancel the reset noise. This can be accomplished if the reset noise is correlated, i.e. the same reset noise component is present in both the reset level and the signal level. The technique of reading out the pixel signal and reset levels and canceling the correlated reset noise after subtraction of the reset level from the signal level is called correlated double sampling (CDS). The subtraction of the reset level from the signal level is usually performed in the column processor of the image sensor. For example, it can be carried out by an amplifier with capacitive feedback that precedes the comparator circuit. The drawback is that this additional stage in the analog chain consumes extra power and adds extra noise. It is therefore advantageous if the comparator circuit of the single-slope ADC can perform the CDS subtraction.

Figures 7A, 7B, 9A, 9B:
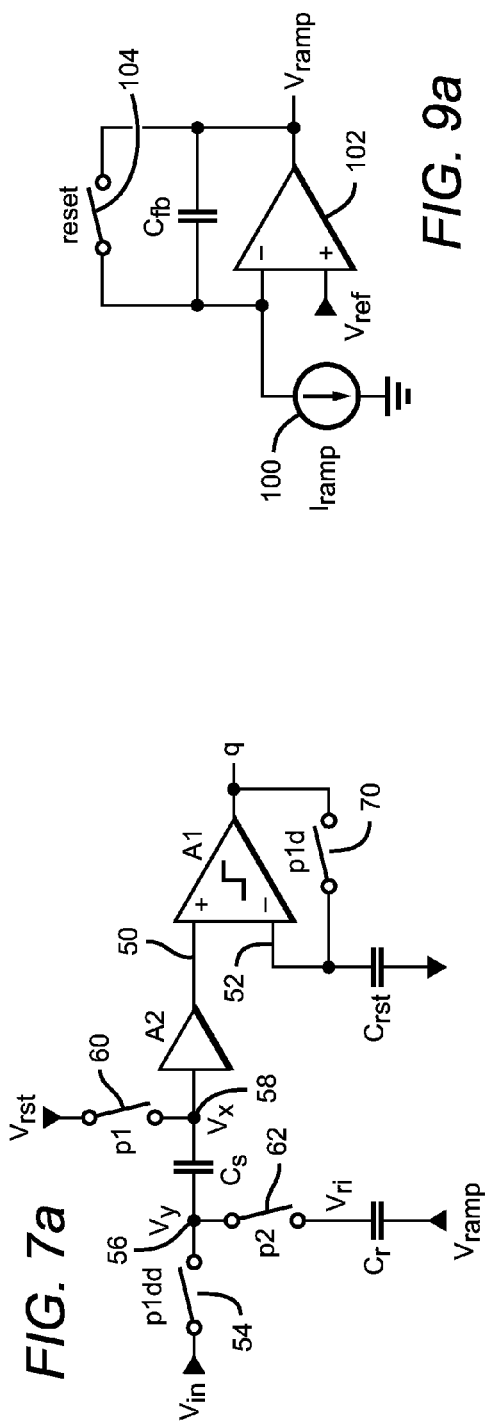

One possible embodiment of the present comparator circuit that includes the CDS feature (i.e. it can perform CDS subtraction) is shown in FIG. 7a and the corresponding timing diagram is shown in FIG. 7b. The first and second reset switches 60 and 70 are controlled by signals p1 and p1d, the input voltage sampling switch 54 is controlled by signal p1dd and the voltage ramp switch 62 is controlled by signal p2. The input voltage to the comparator circuit switches between two levels, $V_{in1}$ and $V_{in2}$, where $V_{in1} > V_{in2}$ for a ramp with positive slope (the opposite is true for a ramp with a negative slope). These two levels are the pixel reset and signal levels. As will be shown next, the comparator circuit of FIG. 7a compares the sampled $V_{in1}-V_{in2}$ with $V_{ramp}$, thereby effectively performing the CDS subtraction. The circuit configuration is similar to those discussed above, except here a ramp capacitor $C_r$ is interposed between $V_{ramp}$ and voltage ramp switch 62. As shown in the timing diagram of FIG. 7b, in operation, first and second reset switches 60 and 70 are closed to apply the buffered $V_{rst}$ to the comparator's first and second input terminals 50 and 52, respectively. Input voltage sampling switch 54 is also closed to apply a first input voltage $V_{in1}$ to sampling capacitor $C_s$. When the first reset switch 60 is opened (p1 falling edge), the voltage $V_{in1}-V_{rst}$ is sampled on capacitor $C_s$ thereby performing a first CDS sampling. A fixed delay later, the second reset switch 70 is opened (p1d falling edge) thereby storing the buffered $V_{rst}$ on capacitor $C_{rst}$. Next, the input voltage transitions from $V_{in1}$ to $V_{in2}$ and the voltage ramp switch 62 is closed (p2 rising edge) to apply $V_{in2}$ to ramp capacitor $C_r$. The input sampling switch 54 is opened (p1dd falling edge) a fixed delay after closing voltage ramp switch 62, thereby sampling $V_{in2}$ on ramp capacitor $C_r$ (second CDS sampling).

When arranged as described above, the output of comparator A1 will toggle when $V_{ramp}=V_{in1}-V_{in2}$. Assuming the ADC is connected to a pixel within a photodetector array, if the pixel output increases with light, then $V_{sig}>V_{rst}$ and the first voltage to be applied to the comparator should be $V_{in1}=V_{sig}$ followed by $V_{in2}=V_{rst}$. If the pixel output decreases with light, then $V_{sig}<V_{rst}$ and the first voltage to be applied to the comparator should be $V_{in1}=V_{rst}$ followed by $V_{in2}=V_{sig}$. The pixel timing should be synchronized with the comparator timing so that the pixel output (which is the comparator input) switches from to $V_{in2}$ in accordance with the timing diagram of FIG. 7b.

The embodiment shown in FIG. 7a includes autozeroing, though this is not essential. For example, the reset circuitry might alternatively be similar to that shown in FIG. 4a.

The arrangement shown in FIG. 7a provides the same advantages as the embodiments described above. However, the input range is limited to ~Vdd/2. To overcome this limitation, as illustrated in FIG. 8a, a comparator circuit equipped to perform CDS might also include the 'ramp disconnect' and 'dummy capacitor' features described above. Both 'ramp disconnect' and 'dummy capacitor' features are shown in FIG. 8a, though it should be noted that the 'ramp disconnect' feature could be used without the 'dummy capacitor' feature.

The 'ramp disconnect' feature may be implemented as described above in relation to FIG. 6a, by providing control signal $p2.\bar{q}$ to the voltage ramp switch 62. This causes the voltage ramp switch to open when the output of comparator A1 toggles to indicate that $V_{ramp}$ exceeds $V_{in}$, thereby increasing the input range of the comparator circuit.

The 'dummy capacitor' feature may also be added in a similar fashion to the implementation in FIG. 6a. As shown in FIG. 8a, a dummy capacitor $C_{dummy}$ is connected between a third node 80 and a constant potential, a first dummy capacitor switch 82 is connected between the third node and $V_{in}$, and a second dummy capacitor switch 84 is connected between the third node and the junction between ramp capacitor $C_r$ and voltage ramp switch 62.

Figure 8B:
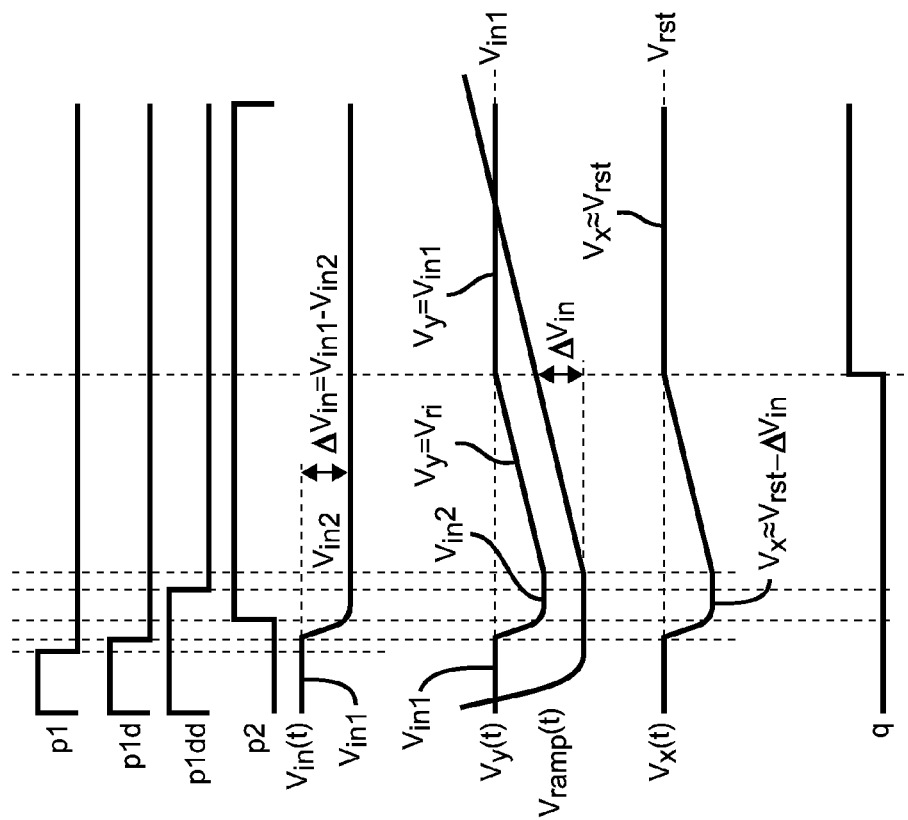
Figure 8A:
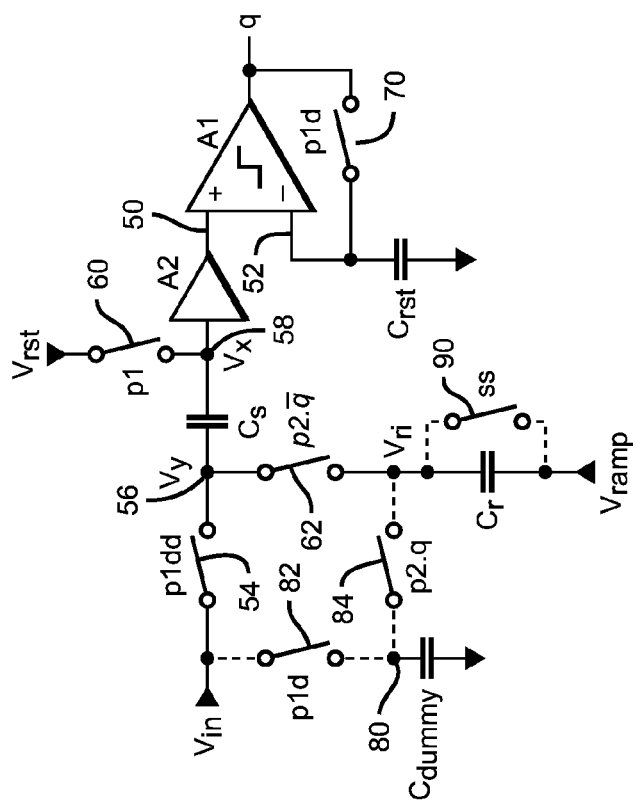
FIG. 8a is a schematic diagram of another possible embodiment of a comparator circuit per the present invention, which includes an autozeroing function and provides CDS along with 'ramp disconnect' and 'dummy capacitor' features.

Operation of the comparator circuit shown in FIG. 8a is illustrated in the timing diagram of FIG. 8b. To further aid the understanding of the circuit's operation, FIG. 8b also shows the voltage waveforms as a function of time for $V_{in}$, $V_x$ (node 58), $V_y$ (node 56) and $V_{ramp}$. To implement CDS, control signals p1, p1d, p1dd and p2 are operated as shown in FIG. 8b and as described above in relation to FIG. 7b. The 'ramp disconnect' and 'dummy capacitor' features are operated as described in relation to FIG. 6a except that first dummy capacitor switch 82 is controlled by signal p1d instead of p1dd. The value of $C_{dummy}$ is preferably selected as described above. During the reset phase, the voltage sampled on $C_s$ when the first reset switch 60 is opened is $V_{in1}-V_{rst}$ and the voltage sampled on $C_r$ when the input voltage sampling switch 54 is opened is $V_{in2}$. During the ramping phase, when $V_{ramp}(t)$ becomes equal to $\Delta V_{in}=V_{in1}-V_{in2}$, because of charge conservation, node 56 ($V_y$) becomes equal to $V_{in2}+\Delta V_{in}=V_{in1}$ and, consequently, node 58 ($V_x$) becomes equal to $V_{rst}$ and comparator A1 reaches its tripping point. Therefore, the output of comparator A1 toggles when $V_{ramp}=\Delta V_{in}=V_{in2}$. The dummy capacitor $C_{dummy}$ is precharged to $V_{in1}$ during the sampling phase (when p1d is high). Then, when the output of comparator A1 toggles to indicate that $V_{ramp}$ has exceeded $\Delta V_{in}=V_{in1}-V_{in2}$, voltage ramp switch 62 opens and second dummy capacitor switch 84 closes, such that the capacitance on $V_{ramp}$ is maintained approximately constant. Due to the 'ramp disconnect' feature the input range of the comparator circuit of FIG. 8a is increased to ~Vdd as can be seen by the following analysis. The maximum input range is such that nodes 56 ($V_y$) and 58 ($V_x$) do not exceed the supply rails during the ramping phase (when p2 is high). As shown in FIG. 8b, the minimum voltage level of $V_x$ is approximately $V_{rst}-\Delta V_{in}$ and the maximum voltage level is $V_{rst}$. If $V_{rst}$ is positioned close to Vdd, then the maximum $\Delta V_{in}=V_{in1}-V_{in2}$ is ~Vdd. As can be seen in FIG. 8b, the voltage on node $V_y$ varies between $V_{in1}$ and $V_{in2}$ during operation and will not exceed the supply rails so long as $V_{in1}$ and $V_{in2}$ (the pixel reset and signal levels) stay within the supply rails.

The present comparator circuit might also optionally include a single sampling ('ss') switch 90 connected across ramp capacitor $C_r$. If switch 90 is open, the comparator circuit performs CDS as previously described. If switch 90 is closed and the falling edge of signal p1dd is moved before the rising edge of signal p2 (as illustrated, for example, in FIG. 6b), then the comparator circuit performs single sampling.

The global voltage ramp $V_{ramp}$ is generated by a global voltage ramp generator, which can be implemented in a variety of ways. One suitable implementation that has already been discussed is shown in FIG. 2. One possible alternative is to use a constant current source and a capacitive trans-impedance amplifier (CTIA), an example of which is shown in FIGS. 9a and 9b. The CTIA is comprised of a feedback capacitor $C_{fb}$ and a reset switch 104 connected between the negative input and the output of an amplifier 102. When the reset switch 104 is closed, the CTIA output $V_{ramp}$ equals $V_{ref}$. When the reset switch is opened (integration phase), the constant input current $I_{ramp}$ is integrated on capacitor $C_{fb}$ and the voltage across it grows linearly. With the CTIA circuit of FIG. 9a, the constant current source 100 flows out of the inverting input port of the amplifier; the CTIA output equals $V_{ref}$ during the reset phase and increases linearly with a slope of $I_{ramp}/C_{fb}$ during the integration phase. With the CTIA circuit of FIG. 9b, the constant current source 100 flows into the inverting input port of the amplifier; the CTIA output equals $V_{ref}$ during the reset phase and decreases linearly with a slope of $I_{ramp}/C_{fb}$ during the integration phase.

Figure 10:
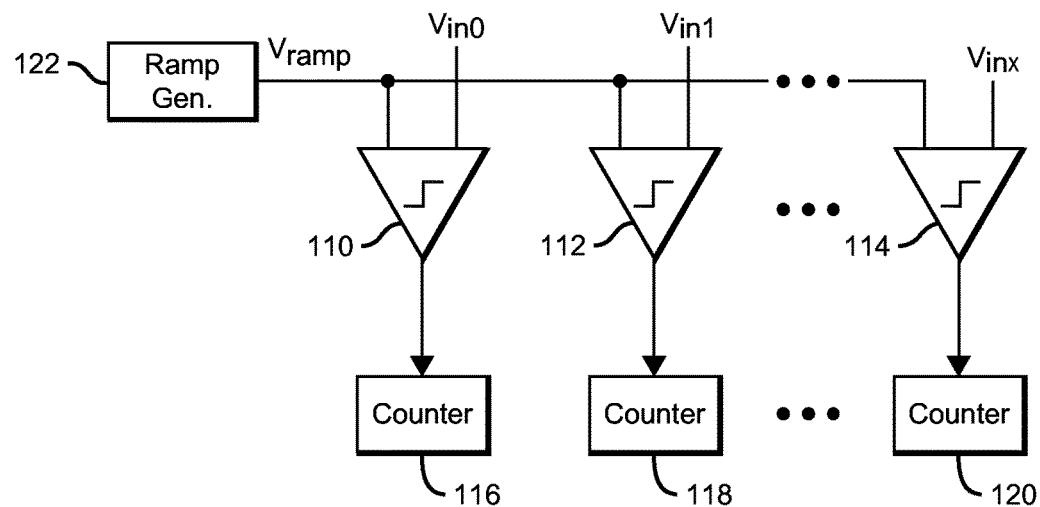
FIG. 10 is a block diagram of an ADC which employs comparator circuits per the present invention and local counters.

A practical column-parallel single-slope ADC would include a plurality of comparator circuits as described herein, with each comparator circuit receiving its input voltage (Vin0, Vin1, . . . , Vinx) from a respective source such as a pixel array column. As shown in FIG. 10, an ADC which includes comparator circuits 110, 112, 114 as described herein would typically include local counters 116, 118, 120 which begin counting when the global voltage ramp $V_{ramp}$ (generated by a ramp generator 122) begins ramping, and stop counting when the output of their respective comparator toggles to indicate that $V_{ramp}$ exceeds the input voltage provided to that comparator, such that the resulting count is a digital representation of the magnitude of the input voltage.

Figure 11:
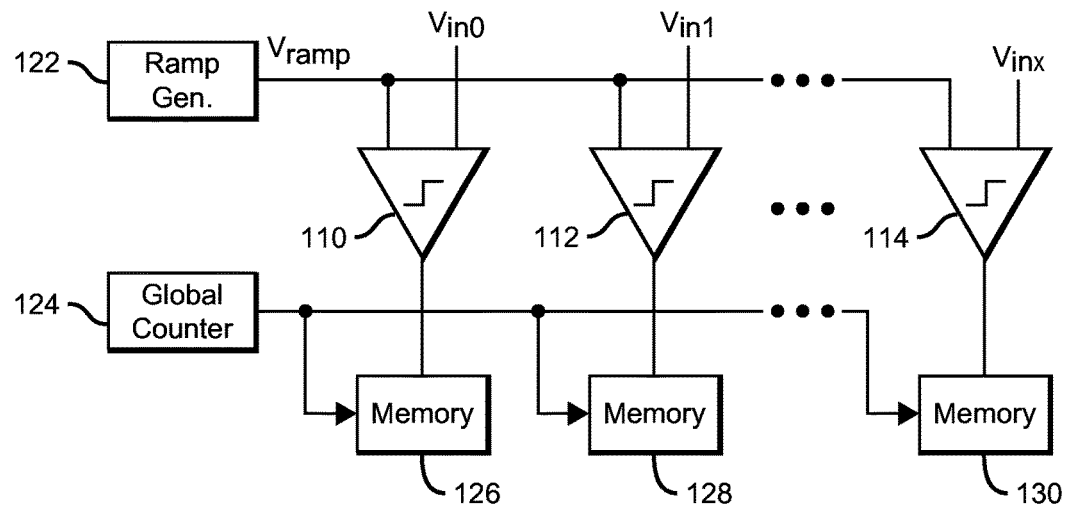
FIG. 11 is a block diagram of an ADC which employs comparator circuits per the present invention and a global counter.

Alternatively, as shown in FIG. 11, instead of a local counter for each comparator, a single global counter 124 whose value is distributed to the ADC columns can be employed. The global counter begins counting when $V_{ramp}$ begins ramping. Then, each column would include local memory 126, 128, 130 arranged to store the global counter's count at the instant when the output of its comparator toggles to indicate that $V_{ramp}$ exceeds the input voltage provided to that comparator, such that the resulting stored count is a digital representation of the magnitude of $V_{in}$.

Note that though FIG. 5 and the subsequent figures are shown with the sampled input voltage being applied to the non-inverting input of comparator A1, this is merely exemplary; the comparator inputs could be reversed and provide the same functionality, with the polarity of output q reversed in this case.

In general, the present comparator circuits make possible high-performance column-parallel single-slope ADCs with large input swing, low noise and power, and good linearity. A large comparator input swing has several benefits. For example, it enables the ADC to accept the full voltage swing from the pixel. This makes possible the use of pixels with a large voltage swing, which require a smaller integrating capacitor for the same charge capacity. A smaller integrating capacitor results in lower input-referred readout noise (in electrons). Also, a large comparator input swing means that for the same ADC noise (in μV), the output ADC noise (in LSB) is lower.

A constant capacitive load and low comparator kickback on the global voltage ramp also provide several benefits. For example, a constant capacitive load enables the ramp to be generated without the need for a buffer, so that an arrangement such as a constant current source flowing into a large capacitor (as shown in FIG. 2) can be used to drive the array of column comparator circuits. This simple solution has the benefit of low noise, low power and good linearity. If the ramp is generated using a CTIA as shown in FIG. 9a or 9b, the constant capacitive load and low comparator kickback would simplify the CTIA amplifier design in terms of settling speed and output impedance. Therefore the CTIA ramp generator can consume less power. Other methods of generating a ramp voltage that are more tolerant of a varying capacitive load often require a high-speed low-impedance buffer and are likely to consume more power and have higher noise.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A comparator circuit suitable for use in a column-parallel single-slope analog-to-digital converter, said comparator circuit comprising:
    a comparator having first and second input terminals;
    an input voltage sampling switch connected between an input voltage and a first node;
    a sampling capacitor connected between said first node and a second node and arranged to store a voltage which varies with said input voltage when said sampling switch is closed;
    an isolation buffer having an input and an output, said buffer input coupled to said second node and said buffer output coupled to said comparator's first input terminal;
    circuitry arranged to apply a reset voltage to said second input terminal of said comparator such that the comparator operating point is independent of the input voltage, said circuitry comprising:
        a first reset switch connected between said second node and a reset voltage;
        a second reset switch connected between said comparator's first input terminal and said comparator's second input terminal when closed; and
        a reset capacitor connected between said comparator's second input terminal and a constant potential; and
    a voltage ramp switch arranged to apply a global voltage ramp to said first node and thereby to said sampling capacitor when closed;
    said comparator circuit arranged such that the output of said comparator toggles when said global voltage ramp exceeds said input voltage, and such that said isolation buffer maintains a substantially constant capacitive load on the said global voltage ramp
    said comparator circuit arranged to:
        close said first and second reset switches to apply said reset voltage to said comparator's first and second input terminals;
        close said input voltage sampling switch to apply said input voltage to said sampling capacitor;
        open said first reset switch;
        open said second reset switch a fixed delay after said first reset switch has been opened;
        open said input voltage sampling switch; and
        close said voltage ramp switch to apply said global voltage ramp to said first node.

2. The comparator circuit of claim 1, wherein said isolation buffer is a source follower circuit.

3. The comparator circuit of claim 1, further comprising a global voltage ramp generator which generates said global voltage ramp.

4. The comparator circuit of claim 3, wherein said global voltage ramp generator comprises:
    a constant current source;
    an enable switch connected between the output of said constant current source and an output node at which said global voltage ramp is provided;
    a capacitor connected between said output node and a constant potential; and
    a reset switch connected between said output node and said constant potential;
    such that the voltage across said capacitor grows linearly when said enable switch is closed and said reset switch is open, and the voltage across said capacitor is reset to said constant potential when said enable switch is open and said reset switch is closed.

5. The comparator circuit of claim 3, wherein said global voltage ramp generator comprises:
    a constant current source; and
    a capacitive trans-impedance amplifier (CTIA);
    said ramp generator arranged such that the output of said constant current source flows either into or out of the inverting input of said CTIA such that said global voltage ramp is produced at the output of said CTIA.

6. The comparator circuit of claim 1, further comprising a local counter which begins counting when said global voltage ramp begins ramping and stops counting when the output of said comparator toggles to indicate that said global voltage ramp exceeds said input voltage, such that the resulting count is a digital representation of the magnitude of said input voltage.

7. The comparator circuit of claim 1, further comprising a global counter which begins counting when said global voltage ramp begins ramping, said circuit further arranged to store said global counter's count in local memory when the output of said comparator toggles to indicate that said global voltage ramp exceeds said input voltage, such that the resulting count is a digital representation of the magnitude of said input voltage.

8. A comparator circuit suitable for use in a column-parallel single-slope analog-to-digital converter, said comparator circuit comprising:
a comparator having first and second input terminals;
an input voltage sampling switch connected between an input voltage and a first node;
a sampling capacitor connected between said first node and a second node and arranged to store a voltage which varies with said input voltage when said sampling switch is closed;
a first reset switch connected between said second node and a reset voltage;
an isolation buffer having an input and an output, said buffer input coupled to said second node and said buffer output coupled to said comparator's first input terminal;
a voltage ramp switch arranged to apply a global voltage ramp to said first node when closed; and
circuitry arranged to apply a reset voltage to said second input terminal of said comparator such that the comparator operating point is independent of the input voltage, said circuitry comprising:
said first reset switch;
a second reset switch arranged to connect said comparator's first input terminal to said comparator's second input terminal when closed; and
a reset capacitor connected between said comparator's second input terminal and a constant potential;
said comparator circuit arranged such that the output of said comparator toggles when said global voltage ramp exceeds said input voltage, and such that said isolation buffer maintains a substantially constant capacitive load on the said global voltage ramp;
said comparator circuit further arranged to:
close said first and second reset switches to apply said reset voltage to said comparator's first and second input terminals;
close said input voltage sampling switch to apply said input voltage to said sampling capacitor;
open said first and second reset switches and said input voltage sampling switch; and
close said voltage ramp switch to apply said global voltage ramp to said first node;
wherein said step of opening said first and second reset switches and said input voltage sampling switch, and said step of closing said voltage ramp switch, comprises:
opening said first reset switch;
opening said second reset switch a fixed delay after said first reset switch has been opened;
opening said sampling switch a fixed delay after said second reset switch has been opened; and
closing said voltage ramp switch a fixed delay after said input voltage sampling switch has been opened.

9. The comparator circuit of claim 8, said comparator circuit arranged such that said global voltage ramp begins ramping a fixed delay after said voltage ramp switch has been closed.

10. A comparator circuit suitable for use in a column-parallel single-slope analog-to-digital converter, said comparator circuit comprising:
a comparator having first and second input terminals;
an input voltage sampling switch connected between an input voltage and a first node;
a sampling capacitor connected between said first node and a second node and arranged to store a voltage which varies with said input voltage when said sampling switch is closed;
an isolation buffer having an input and an output, said buffer input coupled to said second node and said buffer output coupled to said comparator's first input terminal;
a voltage ramp switch arranged to apply a global voltage ramp to said first node when closed; and
circuitry arranged to apply a reset voltage to said second input terminal of said comparator such that the comparator operating point is independent of the input voltage, wherein said comparator's second input terminal is its inverting terminal, said circuitry comprising:
a first reset switch;
a second reset switch connected between said comparator's second input terminal and the output of said comparator; and
a reset capacitor connected between said comparator's second input terminal and a constant potential; said comparator circuit arranged to:
close said first reset switch to apply said reset voltage to said second node;
close said second reset switch to connect the output of said comparator to said reset capacitor;
close said input voltage sampling switch to apply said input voltage to said sampling capacitor;
open said first reset switch;
open said second reset switch a fixed delay after said first reset switch has been opened;
open said input voltage sampling switch; and
close said voltage ramp switch to apply said global voltage ramp to said first node.

11. A comparator circuit suitable for use in a column-parallel single-slope analog-to-digital converter, said comparator circuit comprising:
a comparator having first and second input terminals;
an input voltage sampling switch connected between an input voltage and a first node;
a sampling capacitor connected between said first node and a second node and arranged to store a voltage which varies with said input voltage when said sampling switch is closed;
a first reset switch connected between said second node and a reset voltage;
an isolation buffer having an input and an output, said buffer input coupled to said second node and said buffer output coupled to said comparator's first input terminal;
a voltage ramp switch arranged to apply a global voltage ramp to said first node when closed; and circuitry arranged to apply a reset voltage to said second input terminal of said comparator such that the comparator operating point is independent of the input voltage;

said comparator circuit arranged such that the output of said comparator toggles when said global voltage ramp exceeds said input voltage, and such that said isolation buffer maintains a substantially constant capacitive load on the said global voltage ramp;

wherein said comparator's second input terminal is its inverting terminal, said circuitry comprising:
  said first reset switch;
  a second reset switch connected between said comparator's second input terminal and the output of said comparator; and
  a reset capacitor connected between said comparator's second input terminal and a constant potential;

said comparator circuit arranged to:
  close said first reset switch to apply said reset voltage to said second node;
  close said second reset switch to connect the output of said comparator to said reset capacitor;
  close said input voltage sampling switch to apply said input voltage to said sampling capacitor;
  open said first and second reset switches and said input voltage sampling switch; and
  close said voltage ramp switch to apply said global voltage ramp to said first node;

wherein said step of opening said first and second reset switches and said sampling switch, and said step of closing said voltage ramp switch, comprises:
  opening said first reset switch;
  opening said second reset switch a fixed delay after said first reset switch has been opened;
  opening said input voltage sampling switch a fixed delay after said second reset switch has been opened; and
  closing said voltage ramp switch a fixed delay after said sampling switch has been opened.

12. The comparator circuit of claim 11, said comparator circuit arranged such that said global voltage ramp begins ramping a fixed delay after said voltage ramp switch has been closed.

13. A comparator circuit suitable for use in a column-parallel single-slope analog-to-digital converter, said comparator circuit comprising:
  a comparator having first and second input terminals;
  an input voltage sampling switch connected between an input voltage and a first node;
  a sampling capacitor connected between said first node and a second node and arranged to store a voltage which varies with said input voltage when said sampling switch is closed;
  a voltage ramp switch arranged to apply a voltage ramp to said first node and thereby to said sampling capacitor when closed;
  a first reset switch connected between said second node and a reset voltage;
  an isolation buffer having an input and an output, said buffer input coupled to said second node and said buffer output coupled to said comparator's first input terminal; and
  a voltage ramp switch arranged to apply a global voltage ramp to said first node when closed;
  said comparator circuit arranged such that the output of said comparator toggles when said global voltage ramp exceeds said input voltage, and such that said isolation buffer maintains a substantially constant capacitive load on the said global voltage ramp;
  said comparator circuit further arranged to open said voltage ramp switch when the output of said comparator toggles to indicate that said global voltage ramp exceeds said input voltage, thereby increasing the input range of said comparator circuit;
  said comparator circuit arranged to:
    close said input voltage sampling switch to apply said input voltage to said sampling capacitor; and
    close said voltage ramp switch to apply said voltage ramp to said first node, said comparator circuit arranged such that said voltage ramp begins ramping a fixed delay after said voltage ramp switch has been closed.

14. A comparator circuit suitable for use in a column-parallel single-slope analog-to-digital converter, said comparator circuit comprising:
  a comparator having first and second input terminals;
  an input voltage sampling switch connected between an input voltage and a first node;
  a sampling capacitor connected between said first node and a second node and arranged to store a voltage which varies with said input voltage when said sampling switch is closed:
  a first reset switch connected between said second node and a reset voltage;
  an isolation buffer having an input and an output, said buffer input coupled to said second node and said buffer output coupled to said comparator's first input terminal; and
  a voltage ramp switch arranged to apply a global voltage ramp to said first node when closed;
  said comparator circuit arranged such that the output of said comparator toggles when said global voltage ramp exceeds said input voltage, and such that said isolation buffer maintains a substantially constant capacitive load on the said global voltage ramp;
  said comparator circuit further arranged to open said voltage ramp switch when the output of said comparator toggles to indicate that said global voltage ramp exceeds said input voltage, thereby increasing the input range of said comparator circuit;
  a dummy capacitor connected between a third node and a constant potential;
  a first dummy capacitor switch connected between said third node and said input voltage; and
  a second dummy capacitor switch connected between said third node and said global voltage ramp;
  said comparator circuit arranged to:
    close and open said first dummy capacitor switch synchronously with s aid input voltage sampling switch;
    close said second dummy capacitor switch when the output of said comparator toggles when said global voltage ramp exceeds said input voltage; and
    open said second dummy capacitor switch when said voltage ramp switch is closed;
  said dummy capacitor selected such that its capacitance substantially equals the sum of the parasitic capacitances at said first and second nodes and the input capacitance of said isolation buffer, such that the capacitance on said global voltage ramp is maintained approximately constant before and after the output of said comparator has toggled to indicate that said global voltage ramp has exceeded said input voltage.

15. A comparator circuit suitable for use in a column-parallel single-slope analog-to-digital converter, said comparator circuit comprising:
- a comparator having first and second input terminals;
- an input voltage sampling switch connected between an input voltage and a first node;
- a sampling capacitor connected between said first node and a second node and arranged to store a voltage which varies with said input voltage when said sampling switch is closed;
- a first reset switch connected between said second node and a reset voltage;
- an isolation buffer having an input and an output, said buffer input coupled to said second node and said buffer output coupled to said comparator's first input terminal; and
- a voltage ramp switch arranged to apply a global voltage ramp to said first node when closed;
- said comparator circuit arranged such that the output of said comparator toggles when said global voltage ramp exceeds said input voltage, and such that said isolation buffer maintains a substantially constant capacitive load on the said global voltage ramp;
- said comparator circuit further arranged to open said voltage ramp switch when the output of said comparator toggles to indicate that said global voltage ramp exceeds said input voltage, thereby increasing the input range of said comparator circuit;
- said comparator circuit arranged such that said global voltage ramp begins ramping a fixed delay after said voltage ramp switch has been closed.

16. A comparator circuit suitable for use in a column-parallel single-slope analog-to-digital converter, said comparator circuit comprising:
- a comparator having first and second input terminals;
- an input voltage sampling switch connected between an input voltage and a first node;
- a sampling capacitor connected between said first node and a second node and arranged to store a voltage which varies with said input voltage when said sampling switch is closed;
- a first reset switch connected between said second node and a reset voltage;
- an isolation buffer having an input and an output, said buffer input coupled to said second node and said buffer output coupled to said comparator's first input terminal;
- a voltage ramp switch arranged to apply a global voltage ramp to said first node when closed; and
- circuitry arranged to apply a reset voltage to said second input terminal of said comparator such that the comparator operating point is independent of the input voltage;
- said comparator circuit arranged such that the output of said comparator toggles when said global voltage ramp exceeds said input voltage, and such that said isolation buffer maintains a substantially constant capacitive load on the said global voltage ramp;
- said circuitry comprising:
  - said first reset switch;
  - a reset capacitor connected between said comparator's second input terminal and a constant potential; and
  - a second reset switch arranged to apply said reset voltage to said comparator's second input terminal when closed;
- further comprising a ramp capacitor interposed between said global voltage ramp and said voltage ramp switch to enable correlated double sampling (CDS), said comparator circuit arranged to:
  - close said first and second reset switches to apply said reset voltage to said comparator's first and second input terminals;
  - close said input voltage sampling switch to apply a first input voltage $V_{in1}$ to said sampling capacitor;
  - open said first reset switch, thereby performing a first CDS sampling of said first input voltage $V_{in1}$ on said sampling capacitor;
  - open said second reset switch a fixed delay after said first reset switch;
  - apply a second input voltage $V_{in2}$ to said sampling capacitor;
  - close said voltage ramp switch to apply $V_{in2}$ to said ramp capacitor; and
  - open said input sampling switch a fixed delay after closing said voltage ramp switch, thereby performing the second CDS sampling of said input voltage $V_{in2}$ on said ramp capacitor, said global voltage ramp remaining at reset until said input sampling switch is opened;
- said comparator circuit arranged such that the output of said comparator toggles when said global voltage ramp exceeds $V_{in1}$-$V_{in2}$.

17. The comparator circuit of claim 16, wherein said comparator's second input terminal is its inverting terminal, and said second reset switch is connected between said comparator's second input terminal and the output of said comparator.

18. The comparator circuit of claim 16, wherein said second reset switch is connected between said comparator's first and second input terminals.

19. The comparator circuit of claim 16, said comparator circuit further arranged to open said voltage ramp switch when the output of said comparator toggles to indicate that said global voltage ramp exceeds $V_{in1}$-$V_{in2}$, thereby increasing the input range of said comparator circuit.

20. The comparator circuit of claim 19, further comprising:
- a dummy capacitor connected between a third node and a constant potential;
- a first dummy capacitor switch connected between said third node and said input voltage; and
- a second dummy capacitor switch connected between said third node and the junction between said ramp capacitor and said voltage ramp switch;
- said comparator circuit arranged to:
  - close and open said first dummy capacitor switch synchronously with said second reset switch;
  - close said second dummy capacitor switch when the output of said comparator toggles when said global voltage ramp exceeds $V_{in1}$-$V_{in2}$; and
  - open said second dummy capacitor switch when said voltage ramp switch is closed;
- said dummy capacitor selected such that its capacitance substantially equals the sum of the parasitic capacitances at said first and second nodes and the input capacitance of said isolation buffer, such that the capacitance on said global voltage ramp is maintained approximately constant before and after the output of said comparator has toggled to indicate that said global voltage ramp has exceeded $V_{in1}$-$V_{in2}$.

21. The comparator circuit of claim 16, further comprising a single sampling (ss) switch connected across said ramp capacitor, said comparator circuit arranged such that when said ss switch is closed said comparator circuit performs single sampling and when said ss switch is open said comparator circuit performs correlated double sampling (CDS), said comparator circuit arranged such that, when said ss switch is closed, said input sampling switch is opened before said voltage ramp switch is closed.

22. A column-parallel single-slope analog-to-digital converter (ADC), said ADC comprising:

a plurality of comparator circuits, each of which comprises:

a comparator having first and second input terminals;

an input voltage sampling switch connected between an input voltage and a first node;

a sampling capacitor connected between said first node and a second node and arranged to store a voltage which varies with said input voltage when said sampling switch is closed;

a voltage ramp switch arranged to apply a global voltage ramp to said first node and thereby to said sampling capacitor when closed;

an isolation buffer having an input and an output, said buffer input coupled to said first node and said buffer output coupled to said comparator's first input terminal;

said comparator circuit arranged such that the output of said comparator toggles when said global voltage ramp exceeds said input voltage;

said comparator circuit arranged such that said isolation buffer maintains a substantially constant capacitive load on the said global voltage ramp;

said comparator circuit arranged to:

close said input voltage sampling switch to apply said input voltage to said sampling capacitor; and close said voltage ramp switch to apply said global voltage ramp to said first node, said comparator circuit arranged such that said global voltage ramp begins ramping a fixed delay after said voltage ramp switch has been closed;

each of said comparator circuits receiving its input voltage from a respective source; and a voltage ramp generator which generates said global voltage ramp which is provided to each of said comparator circuits.

23. The ADC of claim 22, wherein said source is a pixel array column.

* * * * *